(12) United States Patent
Wu

(10) Patent No.: US 9,089,215 B1
(45) Date of Patent: Jul. 28, 2015

(54) SLIDING RAIL ASSEMBLY

(71) Applicant: AIC INC., Taoyuan Hsien (TW)

(72) Inventor: Wei-Shih Wu, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 0 days.

(21) Appl. No.: 14/549,781

(22) Filed: Nov. 21, 2014

(51) Int. Cl.
*A47B 88/00* (2006.01)
*A47B 88/10* (2006.01)
*A47B 88/04* (2006.01)
*A47B 88/16* (2006.01)

(52) U.S. Cl.
CPC ............. *A47B 88/10* (2013.01); *A47B 88/0466* (2013.01); *A47B 88/16* (2013.01)

(58) Field of Classification Search
CPC ............... A47B 88/04; A47B 88/0418; A47B 2210/0059; A47B 2210/0013; A47B 88/10; A47B 88/0085; A47B 88/0407; A47B 88/08; A47B 88/16; A47B 2210/0016
USPC ............. 312/334.4, 334.5, 333, 334.1–334.8, 312/223.1, 265.1–265.4, 334.44–334.47; 248/241, 298.1, 257, 265, 269; 211/26, 211/192; 384/26, 35, 21–23
See application file for complete search history.

(56) References Cited

U.S. PATENT DOCUMENTS

| 3,133,768 | A | * | 5/1964 | Klakovich | 384/17 |
| 6,070,957 | A | * | 6/2000 | Zachrai | 312/334.4 |
| 6,230,903 | B1 | * | 5/2001 | Abbott | 211/26 |
| 6,578,939 | B1 | * | 6/2003 | Mayer | 312/334.5 |
| 6,615,992 | B1 | * | 9/2003 | Lauchner et al. | 211/26 |
| 8,727,138 | B2 | * | 5/2014 | Dittus et al. | 211/26 |
| 8,807,351 | B2 | * | 8/2014 | Lin et al. | 211/26 |
| 8,967,744 | B2 | * | 3/2015 | Chen et al. | 312/334.4 |
| 2002/0084734 | A1 | * | 7/2002 | Shih | 312/334.4 |
| 2008/0036247 | A1 | * | 2/2008 | Park | 296/217 |
| 2011/0091141 | A1 | * | 4/2011 | Liang | 384/20 |
| 2014/0132139 | A1 | * | 5/2014 | Chang | 312/333 |

* cited by examiner

*Primary Examiner* — Janet M Wilkens
(74) *Attorney, Agent, or Firm* — Chun-Ming Shih; HDLS IPR Services

(57) ABSTRACT

A sliding rail assembly includes a securing member, a slider, and a positioning member. The securing member is elongated in shape. A fixed positioning structure is disposed on one end of the securing member. The slider is elongated in shape and engaged with the securing member. The slider is slidable longitudinally with respect to the securing member. The positioning member is disposed on the securing member and corresponding in position to the fixed positioning structure. The positioning member is slidable longitudinally with respect to the securing member. The positioning member includes a movable positioning structure. The fixed positioning structure and the movable positioning structure on each end of the securing member are different types for selection according to demands.

14 Claims, 6 Drawing Sheets

SLIDING RAIL ASSEMBLY

BACKGROUND

1. Technical Field

The present invention relates to a sliding rail assembly for a server cabinet and, in particular, to a sliding rail assembly having different types of positioning structures for selection.

2. Related Art

A conventional server cabinet adapted for receiving server equipment utilizes layered drawer-structures to receive the server equipment. Therefore, numerous sliding rails are used in the server cabinet. The sliding rails for the server cabinet are heavy, so they are not easily assembled. Hence, a pair of positioning structures is usually disposed on two ends of the sliding rail. The sliding rail is positioned by engaging the positioning structure into a positioning hole of the server cabinet, and then the sliding rail is screwed to the server cabinet.

There are positioning holes of different specifications, and different types of positioning structures may be incompatible, thus causing inconvenience in assembling the sliding rails.

In view of the foregoing, the inventor made various studies to overcome the above-mentioned problems to realize the improvements, on the basis of which the present invention is accomplished.

BRIEF SUMMARY

The present invention provides a sliding rail assembly which includes different types of positioning structures for selection according different demands.

The present invention provides a sliding rail assembly which comprises a securing member, a slider, and a positioning member. The securing member is elongated in shape, and one end of the securing member includes a fixed positioning structure. The slider is elongated in shape and engaged with the securing member. The slider is slidable longitudinally with respect to the securing member. The positioning member is disposed on the securing member and corresponding in position to the fixed positioning structure. The positioning member is slidable longitudinally with respect to the securing member. The positioning member includes a movable positioning structure.

Preferably, the fixed positioning structure is a pillar protruding out from a body, and the movable positioning structure is a flange extending from the positioning member. The positioning member includes a body which is elongated in shape. The positioning member includes a slide cover movably engaged with one end of the body. The flange extends out from an end portion of the slide cover. A slide groove is longitudinally formed on the slide cover, a stop pin is protrudingly disposed on the body, and the stop pin is inserted into the slide groove to restrict the slide cover to slide longitudinally with respect to the body.

It is preferable that the fixed positioning structure is a flange extending longitudinally from the securing member, and the movable positioning structure is a pillar protruding out from the positioning member. The positioning member includes a body of an elongated shape and an extending board attached to one end of the body. The flange extends out from an end portion of the extending board. The extending board and the positioning member are engaged with each other. A slide groove is longitudinally formed on the extending board, and a stop pin is correspondingly disposed, in a protruding manner, on the positioning member. The stop pin is inserted into the slide groove to restrict the positioning member to slide longitudinally with respect to the body. The positioning member includes a slide block. The slide block and the extending board are movably engaged with each other, so that the positioning member is movably connected to the extending board. The flange extends out from the slide cover.

It is preferable that a plurality of rollers are longitudinally arranged on the securing member. The rollers are arranged in two rows parallel to each other, and each of the rollers contacts against the slider.

According to the present invention, each end of the sliding rail assembly has a different type of positioning structure disposed thereon. Thus, according to the type of the positioning hole of the server cabinet where the sliding rail assembly is to be installed, a corresponding positioning structure is selected for use, so that the sliding rail assembly of the present invention can adapt to server cabinets of different specifications.

DETAILED DESCRIPTION

Figure 1:
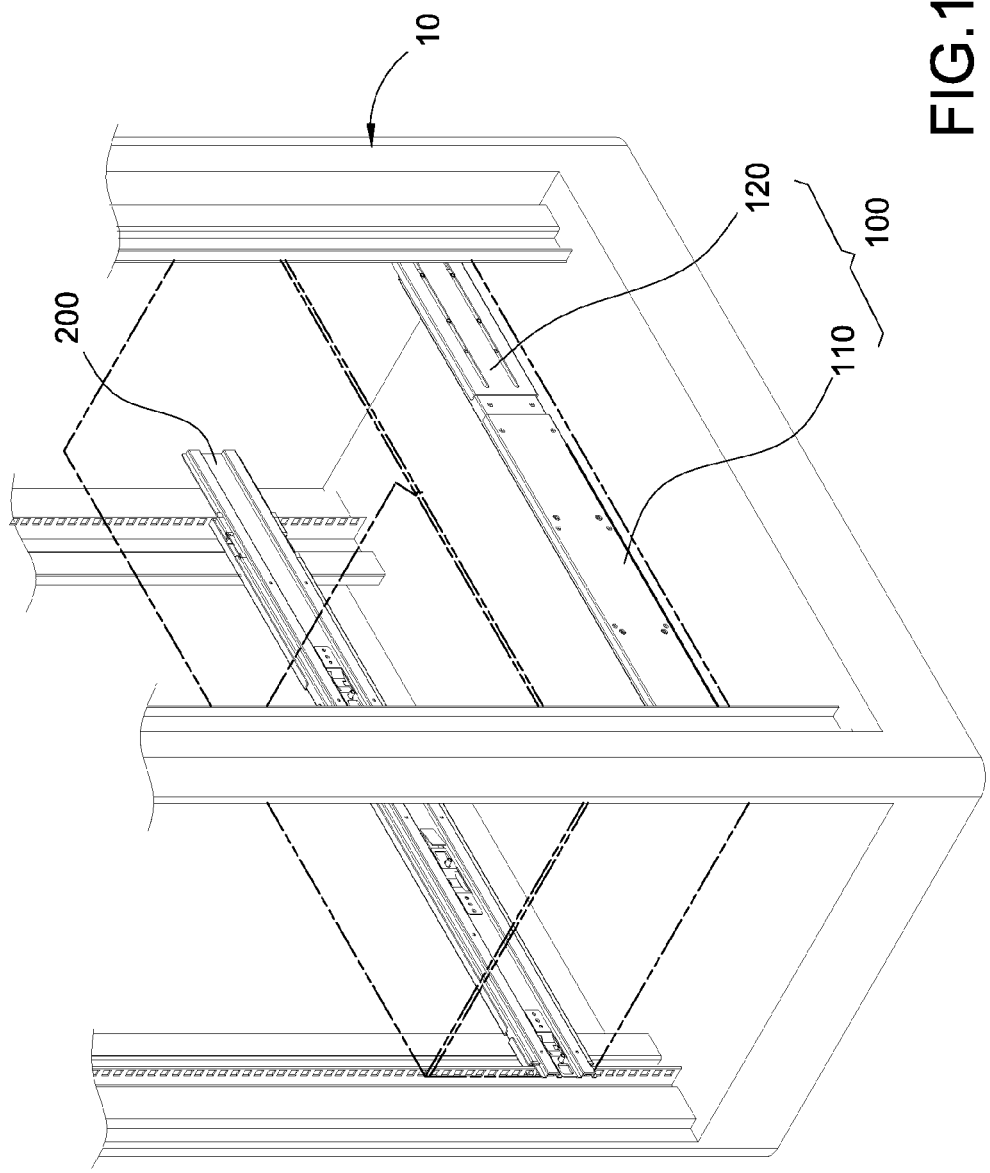
FIG. 1 is a schematic view of a sliding rail assembly according to a preferable embodiment of the present invention.
Figure 2:
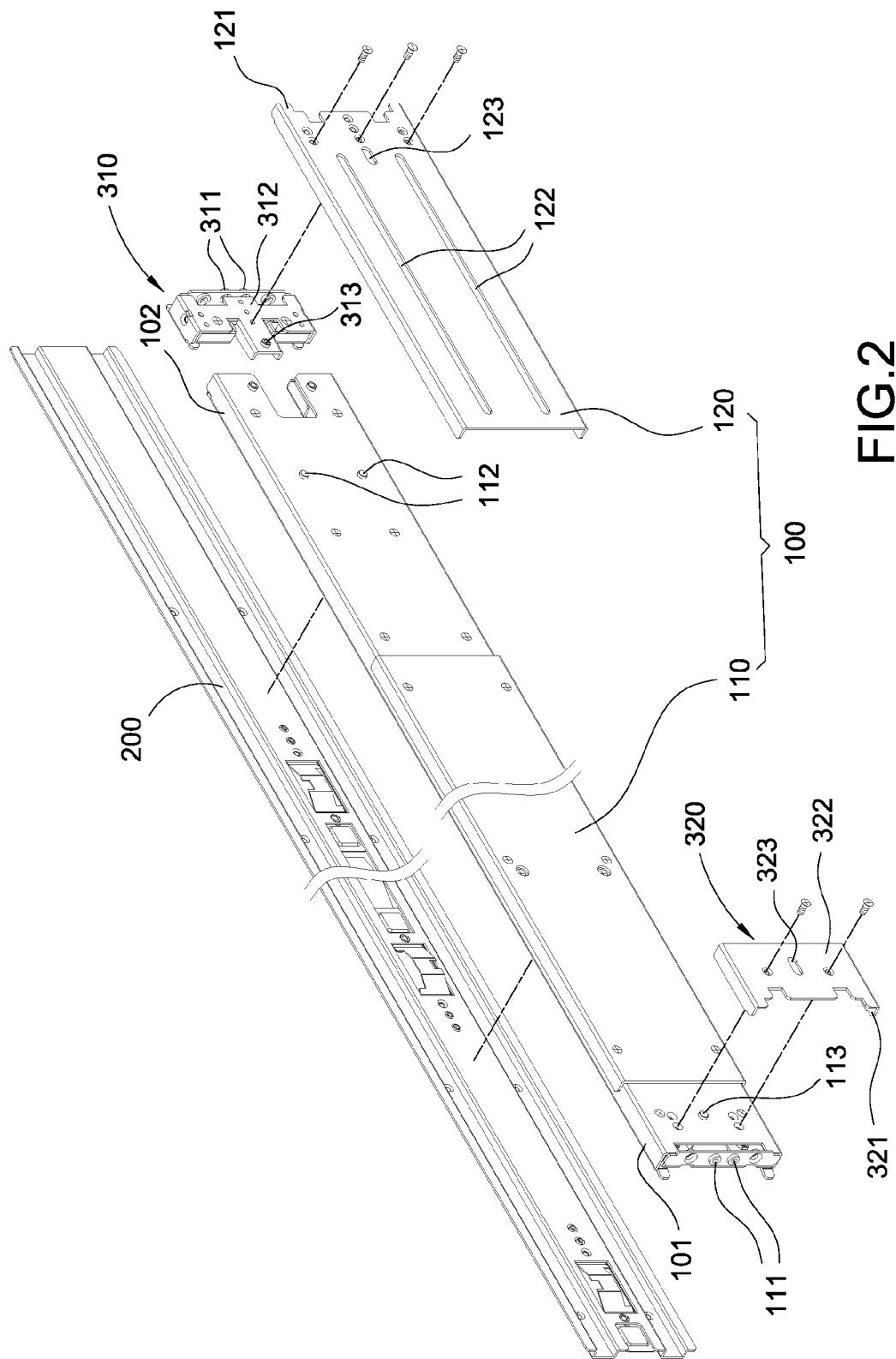
FIG. 2 is a perspective exploded view of the sliding rail assembly according to the preferable embodiment of the present invention.
Figure 3:
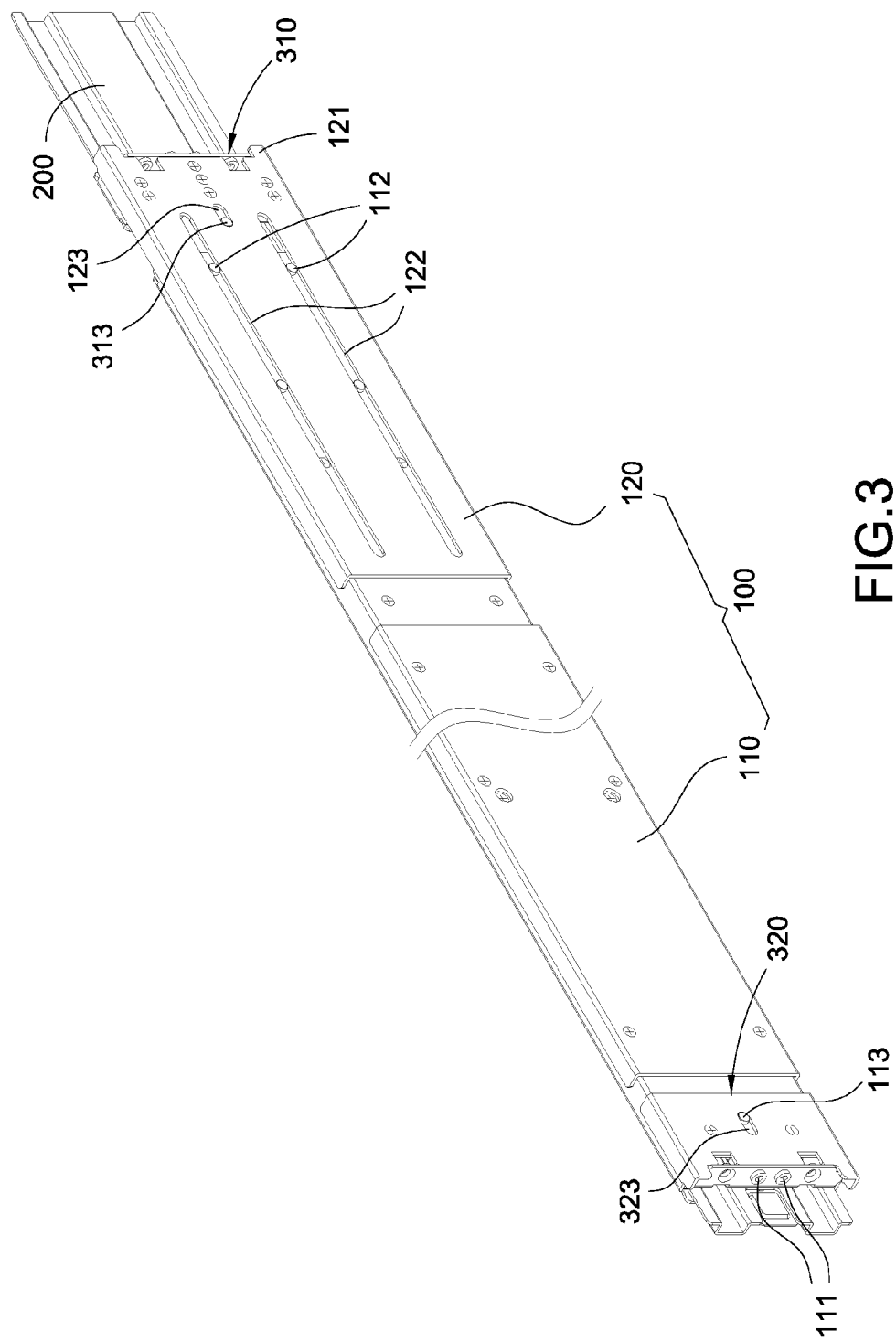
FIG. 3 is a perspective view of the sliding rail assembly according to the preferable embodiment of the present invention.
Figure 4:
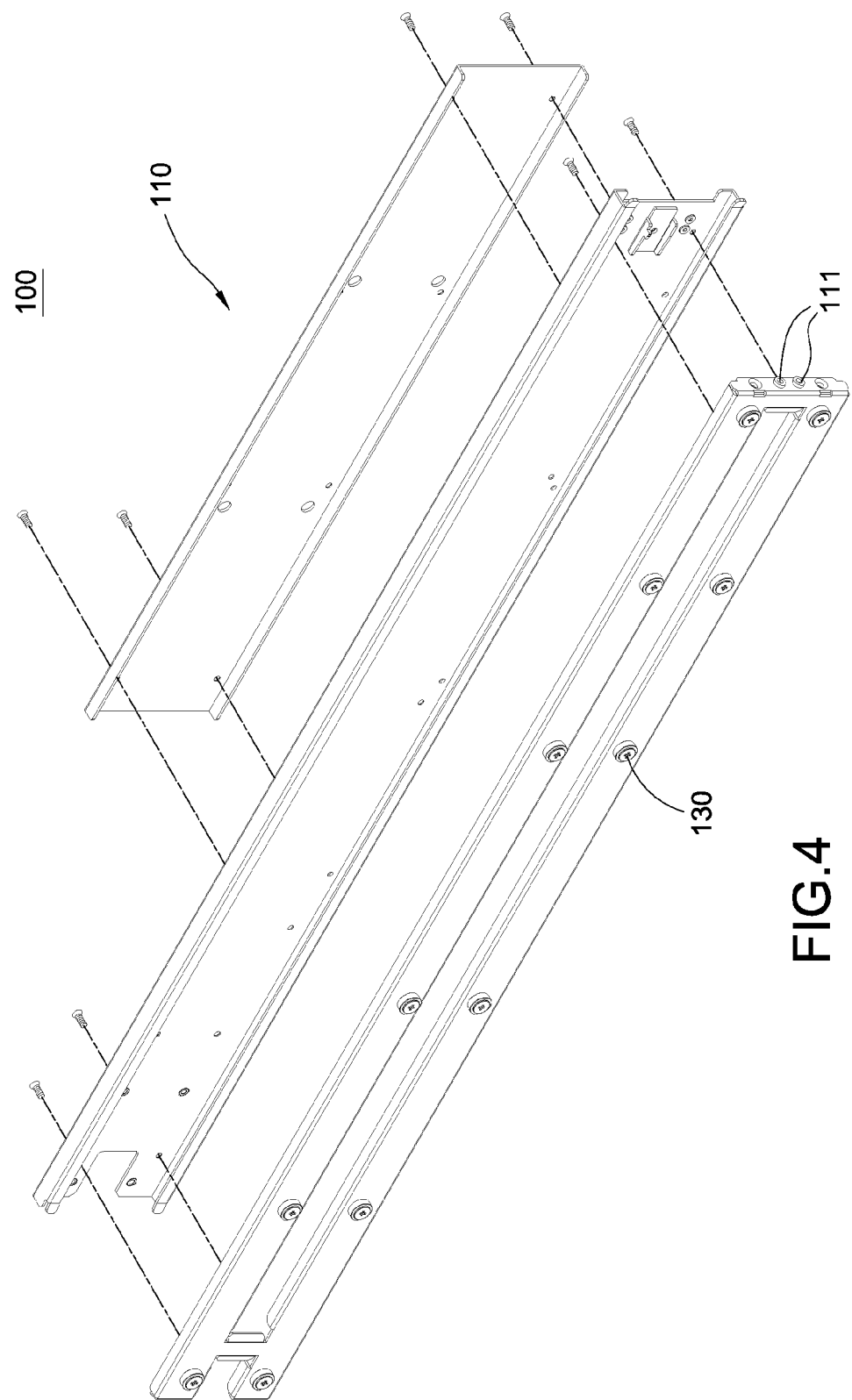
FIG. 4 is a perspective exploded view of a securing member of the sliding rail assembly according to the preferable embodiment of the present invention.

Referring to FIGS. 1 to 4, a sliding rail assembly is provided according to a preferable embodiment of the present invention, which is disposed in a server cabinet 10 to support a load plate, and is for moving the load plate in or out from the server cabinet 10. According to the present embodiment, the sliding rail assembly of the present invention includes a securing member 100, a slider 200, and two types of positioning members 310 and 320.

The securing member 100 is fixedly disposed on an inner side of the server cabinet 10. According to the present embodiment, the securing member 100 includes a body 110 and an extending board 120. The body 110 and the extending board 120 both are in an elongated shape. Two ends of the body 110 are respectively a securing end 101 and an extending end 102. A fixed positioning structure 111 protruding in a longitudinal direction of the body 110 is disposed on the securing end 101. In the present embodiment, the fixed positioning structure 111 on the securing end 101 is preferably a pair of pillars; however, the present invention is not limited thereto. A plurality of rollers 130 are longitudinally arranged on the body 110, and the rollers are arranged, along two sides of the body 110, in two rows parallel to each other. The extending board 120 has a U-shaped cross-section. The extending board 120 is engaged with an extending end 102 of the body 110, so the extending board 120 is slidable longitudinally with respect to the body 110 to adjust the total length of the securing member 100 according to different sizes of the server cabinet 10. Another fixed positioning structure 121 protruding in the longitudinal direction of the body 110 is disposed on an end portion of the extending board 120. The securing end 101 and the extending end 102 respectively have a different type of fixed positioning structure 111/121. In the present embodiment, the fixed positioning structure 121 on the extending board 120 is preferably a pair of L-shaped flanges; however, the present invention is not limited thereto. A pair of slide grooves 122 is longitudinally formed on the extending board 120, and two pairs of stop pins 112 are correspondingly disposed on the body 110 in a protruding manner, wherein each slide groove 122 has two corresponding stop pins 112 inserted thereto, so as to restrict a sliding route of the extending board 120. Each stop pin 112 can include a screw screwed thereto, so as to fix the position of the extending board 120 on the body 110.

The slider 200 is slidable longitudinally with respect to the securing member 100 and is provided for securing a load plate, whereby the load plate is capable of moving in or moving out of the server cabinet 10. According to the present embodiment, the slider 200 is in an elongated sheet shape and has a U-shaped cross-section. The slider 200 and the body 110 of the securing member 100 are engaged with each other. The inner edges of two sides of the slider 200 contact against each row of the rollers 130 respectively, so that the slider 200 is slidable longitudinally with respect to the securing member 100.

Each positioning member 310/320 is disposed on a respective one of the two ends of the securing member 100 and corresponding in position to the fixed positioning structure 111/121, and is slidable longitudinally with respect to the securing member 100. According to the present embodiment, the securing member 310 preferably includes a slide block 312 which is movably engaged with the extending board 120. A movable positioning structure 311 protrudes out from an end portion of the slide block 312, and the movable positioning structure 311 is preferably a pair of pillars. A stop pin 313 is protrudingly disposed on the positioning member 310. Another slide groove 123 corresponding to the stop pin 313 is formed on the extending board 120. The stop pin 313 is inserted into the corresponding slide groove 123 so as to restrict the positioning member 310 to slide longitudinally in a fixed route along the body 110. A screw may be screwed onto the stop pin 313 to fix the position of the positioning member 310 on the securing member 100.

Another positioning member 320 includes a slide cover 322. The slide cover 322 is movably engaged with the securing end 101 of the body 110. Another movable positioning structure 321 extends out from an end portion of the slide cover 322. According to the present embodiment, the movable positioning structure 321 is a pair of L-shaped flanges. A slide groove 323 is longitudinally formed on the slide cover 322. Another stop pin 113 is protrudingly disposed on the body 110. The stop pin 113 is inserted into the slide groove 323, so as to restrict the slide cover 322 to slide longitudinally in a fixed route along the body 110. A screw can be screwed onto the stop pin 113, so as to fix the position of the positioning member 320 on the securing member 100.

The fixed positioning structure 111 (or 121) is the same type as the movable positioning structure 311 (or 321) on the other end of the securing member 100. Moreover, the fixed positioning structure 111 (or 121) and the movable positioning structure 321 (or 311) on the same end of the securing member 100 are different types.

Figure 5:
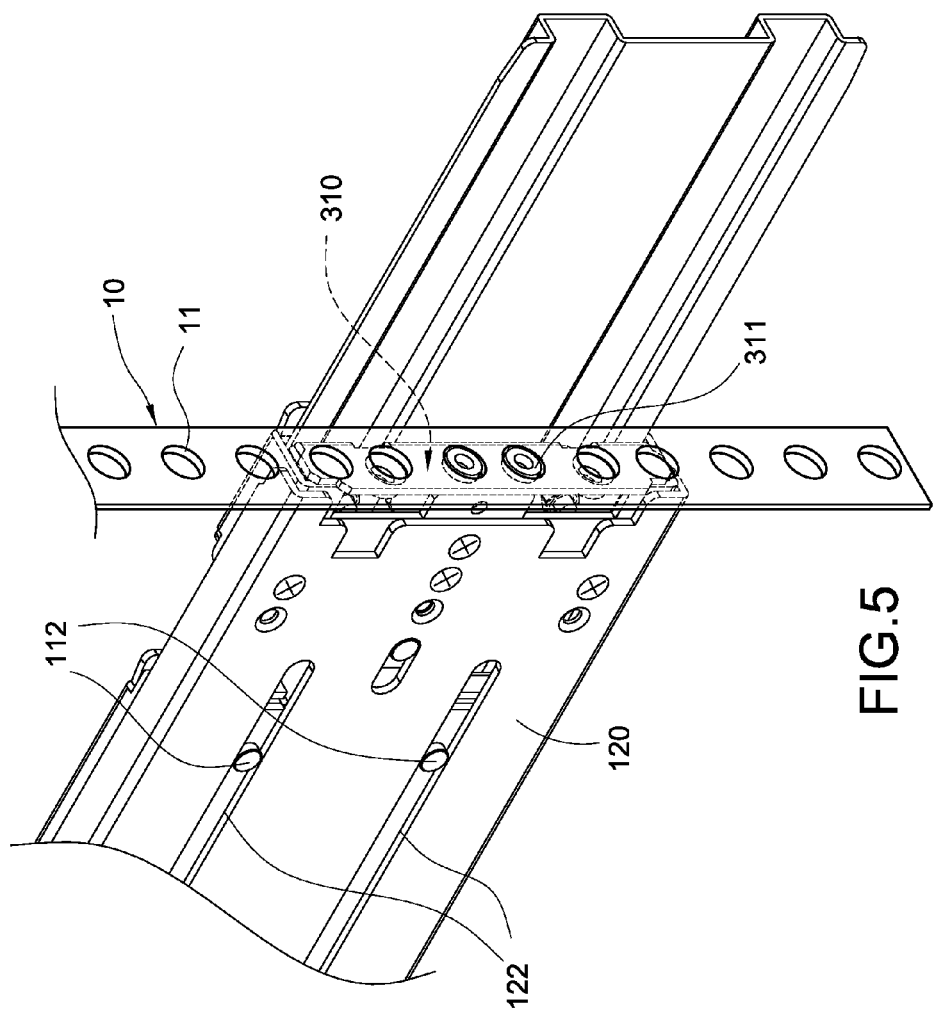
FIG. 5 is a schematic view illustrating a use state of the sliding rail assembly according to the preferable embodiment of the present invention.

Referring to FIG. 5, in the present embodiment, when the server cabinet 10, where the sliding rail assembly is to be fixed, has a positioning hole 11 of a circular shape, the pillar-type positioning structure 111 and movable positioning structure 311 are utilized to position the sliding rail assembly to the server cabinet 10, thereby facilitating fixing the sliding rail assembly. The positioning method is described as follows. First, the positioning member 310/320 is slid back. The pillar-type fixed positioning structure 111 is engaged into the positioning hole 11 on one side of the server cabinet 10 to position one end of the sliding rail assembly. Then, the positioning member 310 on the other end of the sliding rail assembly is pushed out to engage the pillar-type movable positioning structure 311 thereon into the positioning hole 11 on the other side of the server cabinet 10, and thereby the sliding rail assembly is positioned in the server cabinet 10. It is preferable that, after the movable positioning structure 311 is engaged into the positioning hole 11, the screw on the stop pin 313 can be screwed tightly to fix the positioning member 310 and the extending board 120.

Figure 6:
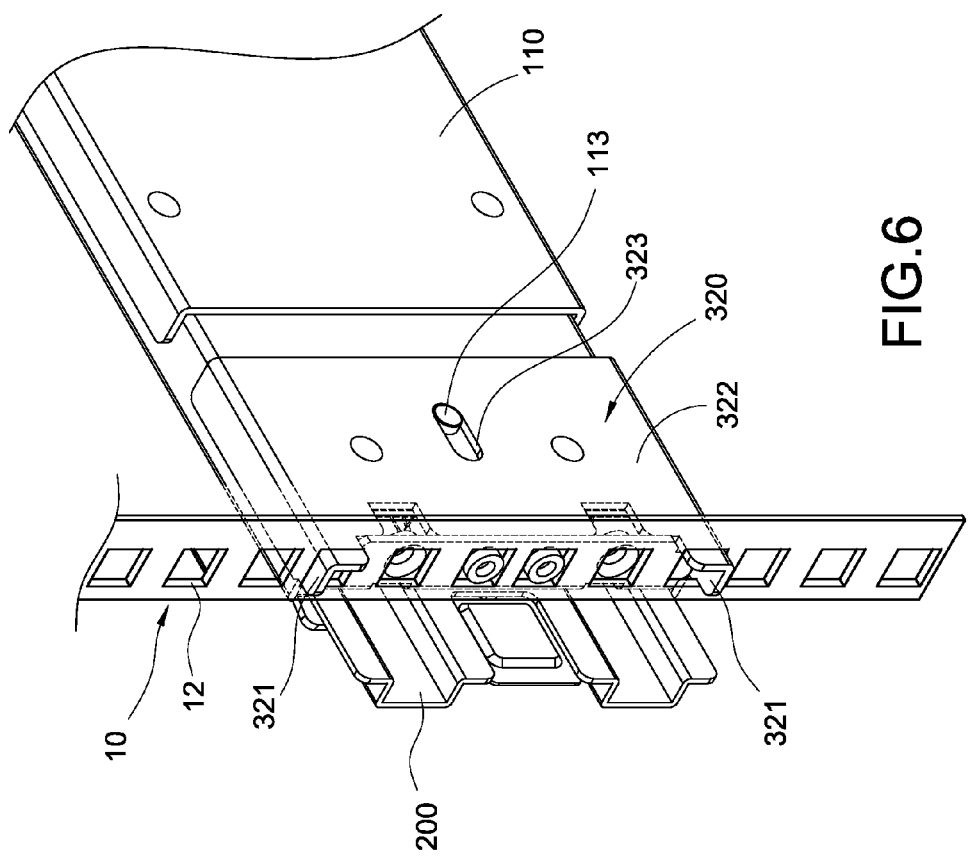
FIG. 6 is a schematic view illustrating another use state of the sliding rail assembly according to the preferable embodiment of the present invention.

Referring to FIG. 6, in the present embodiment, when the server cabinet 10, where the sliding rail assembly is to be fixed, has a positioning hole 12 of a square shape, the L-shaped flange-type fixed positioning structure 121 and the movable positioning structure 321 at two ends of the sliding rail assembly are utilized to position the sliding rail assembly in the server cabinet, so as to facilitate fixing the sliding rail assembly. The positioning method is described as follows. First, the positioning member 310/320 is slid back. Then, the L-shaped flange-type fixed positioning structure 111 is engaged into the positioning hole 12 on one side of the server cabinet 10 to position one end of the sliding rail assembly. After that, the positioning member 320 on the other end of the sliding rail assembly is pushed out to engage the L-shaped flange-type movable positioning structure 321 thereon into the positioning hole 12 on the other side of the server cabinet 10, so as to position the sliding rail assembly in the server cabinet 10. It is preferable that, after the movable positioning structure 321 is engaged into the positioning hole 11, the screw on the stop pin 113 can be screwed tightly to fix the positioning member 320 and the body 110.

The positioning structure 111 (or 121) and movable positioning structure 311 (or 321) disposed at each end of the securing member 100 are different types. Therefore, according to the type of the positioning hole 12 of the server cabinet 10 where the sliding rail assembly is to be installed, a corresponding fixed positioning structure 111 (or 121) and a corresponding movable positioning structure 311 (or 321) are selected for use, so as to position the sliding rail assembly in the server cabinet 10 to facilitate screwing the sliding rail assembly. Therefore, the sliding rail assembly of the present invention can adapt to a variety of server cabinets 10 having different positioning holes 12.

It is to be understood that the above descriptions are merely a preferable embodiment of the present invention and not intended to restrict the scope of the present invention. Equivalent changes and modifications made in the spirit of the present invention are regarded as falling within the scope of the present invention.

What is claimed is:
1. A sliding rail assembly, comprising:
   a securing member, the securing member being elongated in shape and having a fixed positioning structure on one end of the securing member;
   a slider, the slider being elongated in shape and engaged with the securing member, the slider being slidable longitudinally with respect to the securing member; and
   a positioning member disposed at the end of the securing member and corresponding to the fixed positioning structure, the positioning member being slidable longitudinally with respect to the securing member, the positioning member including a movable positioning structure, wherein a plurality of rollers are disposed longitudinally on the securing member, and each of the rollers contacts against the slider.

2. The sliding rail assembly of claim 1, wherein the fixed positioning structure is a pillar longitudinally protruding out from the securing member, and the movable positioning structure is a flange extending from the positioning member.

3. The sliding rail assembly of claim 2, wherein the securing member includes a body being elongated in shape, the positioning member includes a slide cover movably engaged with one end of the body, and the flange extends out from an end portion of the slide cover.

4. The sliding rail assembly of claim 3, wherein the pillar protrudes from the body.

5. The sliding rail assembly of claim 3, wherein a slide groove is longitudinally formed on the slide cover, a stop pin is protrudingly disposed on the body, and the stop pin is inserted into the slide groove to restrict the slide cover to slide longitudinally with respect to the body.

6. The sliding rail assembly of claim 1, wherein the fixed positioning structure is a flange extending longitudinally from the securing member, and the movable positioning structure is a pillar protruding from the positioning member.

7. The sliding rail assembly of claim 6, wherein the securing member includes a body being elongated in shape and an extending board attached to one end of the body, and the flange extends out from an end portion of the extending board.

8. The sliding rail assembly of claim 7, wherein the extending board and the positioning member are engaged with each other.

9. The sliding rail assembly of claim 8, wherein a slide groove is longitudinally formed on the extending board, a stop pin is protrudingly formed on the positioning member, and the stop pin is inserted into the slide groove to restrict the positioning member to slide longitudinally with respect to the body.

10. The sliding rail assembly of claim 8, wherein the positioning member is movably connected to the extending board.

11. The sliding rail assembly of claim 10, wherein the positioning member includes a slide block, the slide block and the extending board are movably engaged with each other, and the flange extends out from the slide cover.

12. The sliding rail assembly of claim 1, wherein the rollers are arranged in two rows parallel to each other.

13. The sliding rail assembly of claim 1, wherein the fixed positioning structure is the same type as another movable positioning structure on the other end of the securing member.

14. The sliding rail assembly of claim 1, wherein the fixed positioning structure and the movable positioning structure which are on the same end of the securing member are different types.

* * * * *